United States Patent
Okazaki et al.

(10) Patent No.: US 10,588,251 B2
(45) Date of Patent: Mar. 10, 2020

(54) MOUNTING TARGET WORKING DEVICE

(71) Applicant: YAMAHA HATSUDOKI KABUSHIKI KAISHA, Iwata-shi, Shizuoka-ken (JP)

(72) Inventors: Shinichi Okazaki, Iwata (JP); Naoki Suzuki, Iwata (JP)

(73) Assignee: YAMAHA HATSUDOKI KABUSHIKI KAISHA, Shizuoka-ken (JP)

(*) Notice: Subject to any disclaimer, the term of this patent is extended or adjusted under 35 U.S.C. 154(b) by 0 days.

(21) Appl. No.: 16/068,829

(22) PCT Filed: Jan. 12, 2016

(86) PCT No.: PCT/JP2016/050738
§ 371 (c)(1),
(2) Date: Jul. 9, 2018

(87) PCT Pub. No.: WO2017/122281
PCT Pub. Date: Jul. 20, 2017

(65) Prior Publication Data
US 2019/0037739 A1    Jan. 31, 2019

(51) Int. Cl.
H05K 5/00        (2006.01)
H05K 13/04       (2006.01)
H05K 13/00       (2006.01)
H05K 13/08       (2006.01)

(52) U.S. Cl.
CPC ..... H05K 13/0413 (2013.01); H05K 13/0069 (2013.01); H05K 13/0406 (2018.08); H05K 13/0409 (2018.08); H05K 13/0411 (2018.08); H05K 13/0419 (2018.08); H05K 13/0812 (2018.08); H05K 13/0815 (2018.08)

(58) Field of Classification Search
CPC .................................................. H05K 5/00
See application file for complete search history.

(56) References Cited

U.S. PATENT DOCUMENTS 6,370,764 B1 *  4/2002  Kinoshita ........... H05K 13/041
                                              29/740
6,554,238 B1 *  4/2003  Hibberd ............... A47B 81/061
                                              248/278.1
2016/0015167 A1 *  1/2016  Abu-Akel .............. A47B 21/02
                                              248/161

FOREIGN PATENT DOCUMENTS

JP    H08-075421 A    3/1996
JP    2012-119643 A   6/2012
JP    5721469 B2      5/2015

OTHER PUBLICATIONS

International Search Report issued in PCT/JP2016/050738; dated Apr. 19, 2016.

(Continued)

Primary Examiner — Jerry Wu
(74) Attorney, Agent, or Firm — Studebaker & Brackett PC

(57) ABSTRACT

A mounting target working device includes a mounting target holding unit that holds a mounting target. The mounting target holding unit includes a lift mechanism that moves the mounting target in an upward-downward direction, a tilt mechanism attached to the lift mechanism and that tilts the mounting target, and a rotation mechanism attached to the tilt mechanism and that rotates the mounting target. The rotation mechanism is supported in a cantilever manner by the tilt mechanism.

20 Claims, 7 Drawing Sheets

(56) References Cited

OTHER PUBLICATIONS

Written Opinion issued in PCT/JP2016/050738; dated Apr. 19, 2016.
An Office Action issued by the Chinese Patent Office dated Jun. 19, 2019, which corresponds to Chinese Patent Application No. 201680066938.0 and is related to U.S. Appl. No. 16/068,829; with English language translation.

* cited by examiner

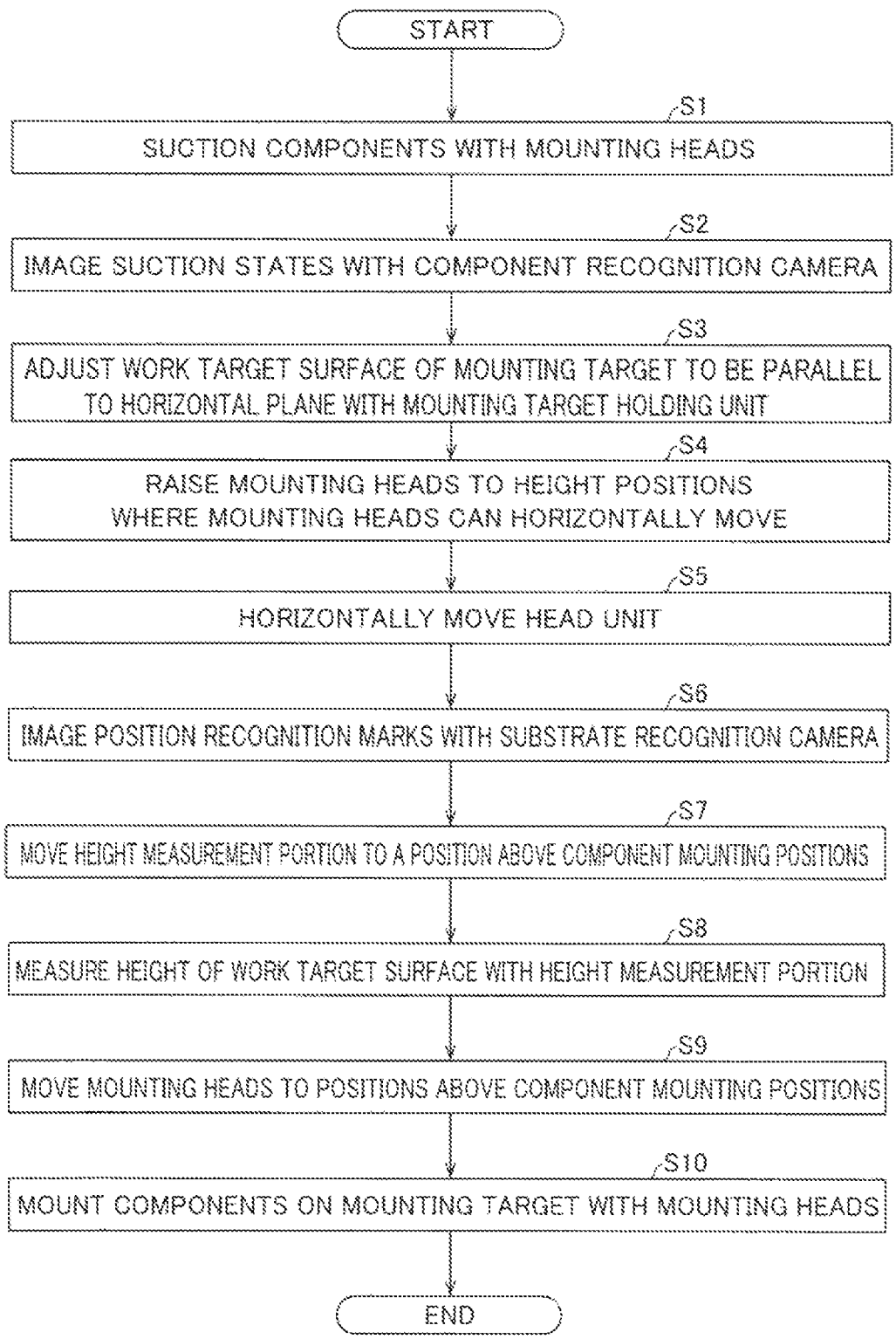

MOUNTING TARGET WORKING DEVICE

CROSS-REFERENCE TO RELATED APPLICATION

This application is a National Stage of International Patent Application No. PCT/JP2016/050738, filed Jan. 12, 2016, the entire content of which is incorporated herein by reference.

BACKGROUND

Technical Field

The present disclosure relates to a mounting target working device, and more particularly, the present disclosure relates to a mounting target working device that performs work while holding a mounting target.

Background Art

In general, a mounting target working device that performs work while holding a mounting target is known. For example, Japanese Patent No. 5721469 discloses a component mounting device (mounting target working device) including a substrate holding device that holds a substrate (mounting target) having a non-flat component mounting surface and a component transfer device that mounts components on the substrate held by the substrate holding device. In this component mounting device, the substrate holding device is provided with a substrate holding table that holds the substrate. In addition, the substrate holding device is provided with a holding table rotating device that rotates the substrate together with the substrate holding table. Furthermore, the substrate holding device is provided with a rotating device that tilts the substrate together with the substrate holding table by rotating the substrate holding table about an axis in a substrate conveyance direction. In the substrate holding device of this component mounting device, the holding table rotating device that rotates the substrate has a structure supported from both sides in the substrate conveyance direction by the rotating device that tilts the substrate.

SUMMARY

However, in the component mounting device disclosed in the aforementioned Japanese Patent No. 5721469, there is a problem that the holding table rotating device has a structure supported from both sides by the rotating device, and hence it is difficult to downsize the substrate holding device (mounting target holding unit).

Therefore, the present disclosure provides a mounting target working device capable of downsizing a mounting target holding unit.

A mounting target working device according to an aspect of the present disclosure includes a mounting target holding unit that holds a mounting target on which a component is mounted, and a working portion that performs work on the mounting target held by the mounting target holding unit. The mounting target holding unit includes a holding portion that holds the mounting target, a lift mechanism that moves the mounting target held by the holding portion in an upward-downward direction, a tilt mechanism attached to the lift mechanism and that tilts the mounting target held by the holding portion, and a rotation mechanism attached to the tilt mechanism and that rotates the mounting target held by the holding portion. The rotation mechanism is supported in a cantilever manner by the tilt mechanism.

In the mounting target working device according to this aspect of the present disclosure, as hereinabove described, the rotation mechanism is supported in the cantilever manner by the tilt mechanism. Thus, the structure of the tilt mechanism to support the rotation mechanism can be simplified as compared with the case where the rotation mechanism is supported from both sides by the tilt mechanism, and hence the mounting target holding unit can be downsized.

In the aforementioned mounting target working device according to this aspect, the tilt mechanism is preferably supported in a cantilever manner by the lift mechanism. According to this configuration, in addition to the structure of the tilt mechanism to support the rotation mechanism, the structure of the lift mechanism to support the rotation mechanism can be simplified, and hence the mounting target holding unit can be further downsized.

In this case, the tilt mechanism is preferably supported in the cantilever manner by the lift mechanism in a horizontal direction, and the rotation mechanism is preferably supported in the cantilever manner by the tilt mechanism in the horizontal direction. According to this configuration, both the tilt mechanism and the rotation mechanism are supported in the cantilever manner in the horizontal direction, and hence it is possible to significantly reduce or prevent an increase in the size of the mounting target holding unit in the upward-downward direction.

In the aforementioned configuration in which the tilt mechanism and the rotation mechanism are supported in the cantilever manner in the horizontal direction, the lift mechanism, the tilt mechanism, and the rotation mechanism are preferably disposed such that a first attachment direction of the tilt mechanism with respect to the lift mechanism and a second attachment direction of the rotation mechanism with respect to the tilt mechanism are substantially perpendicular to each other in a planar view. According to this configuration, unlike the case where the first attachment direction of the tilt mechanism with respect to the lift mechanism and the second attachment direction of the rotation mechanism with respect to the tilt mechanism are substantially parallel to each other in the planar view, it is possible to significantly reduce or prevent an increase in the size of the mounting target holding unit in one direction as viewed in the planar view.

In the aforementioned configuration in which the tilt mechanism and the rotation mechanism are supported in the cantilever manner, a first distance between the lift mechanism and the tilt mechanism in a first attachment direction of the tilt mechanism with respect to the lift mechanism is preferably shorter than a second distance that the lift mechanism can move the mounting target in the upward-downward direction, and a third distance between the lift mechanism and the rotation mechanism in a second attachment direction of the rotation mechanism with respect to the tilt mechanism is preferably shorter than the second distance that the lift mechanism can move the mounting target in the upward-downward direction. According to this configuration, the tilt mechanism and the rotation mechanism can be disposed in the vicinity of the lift mechanism, and hence even when the tilt mechanism and the rotation mechanism are supported in the cantilevered manner, the tilt mechanism and the rotation mechanism can be stably supported.

In the aforementioned mounting target working device according to this aspect, the holding portion of the mounting target holding unit is preferably configured to hold the mounting target via a placement member on which the mounting target is placed. According to this configuration, even when a held portion held by the mounting target holding unit is not provided on the mounting target, the mounting target can be held by the mounting target holding unit via the placement member.

In this case, the placement member preferably includes a placement portion and a single held portion, and the holding portion of the mounting target holding unit is preferably configured to hold the mounting target via the placement portion by grasping the single held portion of the placement member. According to this configuration, the mounting target can be held simply by grasping the single held portion with the mounting target holding unit, and hence the configuration of the mounting target holding unit can be simplified as compared with the case where the mounting target holding unit needs to grasp a plurality of held portions.

In the aforementioned mounting target working device according to this aspect, the working portion preferably includes a plurality of working heads linearly arrayed, and the tilt mechanism of the mounting target holding unit is preferably configured to tilt the mounting target by rotating the mounting target about an axis that extends in a direction substantially parallel to an array direction of the plurality of working heads. According to this configuration, even when the mounting target is tilted, it is possible to significantly reduce or prevent interference between the plurality of working heads and the tilted mounting target. Consequently, the plurality of working heads can be brought closer to the mounting target in advance, and hence the work time of the working portion for the mounting target can be reduced.

According to the present disclosure, as hereinabove described, it is possible to provide the mounting target working device capable of downsizing the mounting target holding unit.

BRIEF DESCRIPTION OF THE DRAWINGS

FIG. 13 is a flowchart for illustrating processing for mounting on a work target surface performed by the mounting target working device according to the embodiment.

DETAILED DESCRIPTION

An embodiment embodying the present disclosure is hereinafter described on the basis of the drawings.

Configuration of Mounting Target Working Device

The configuration of a mounting target working device 100 according to an embodiment of the present disclosure is now described with reference to FIGS. 1 to 12.

Figure 1:
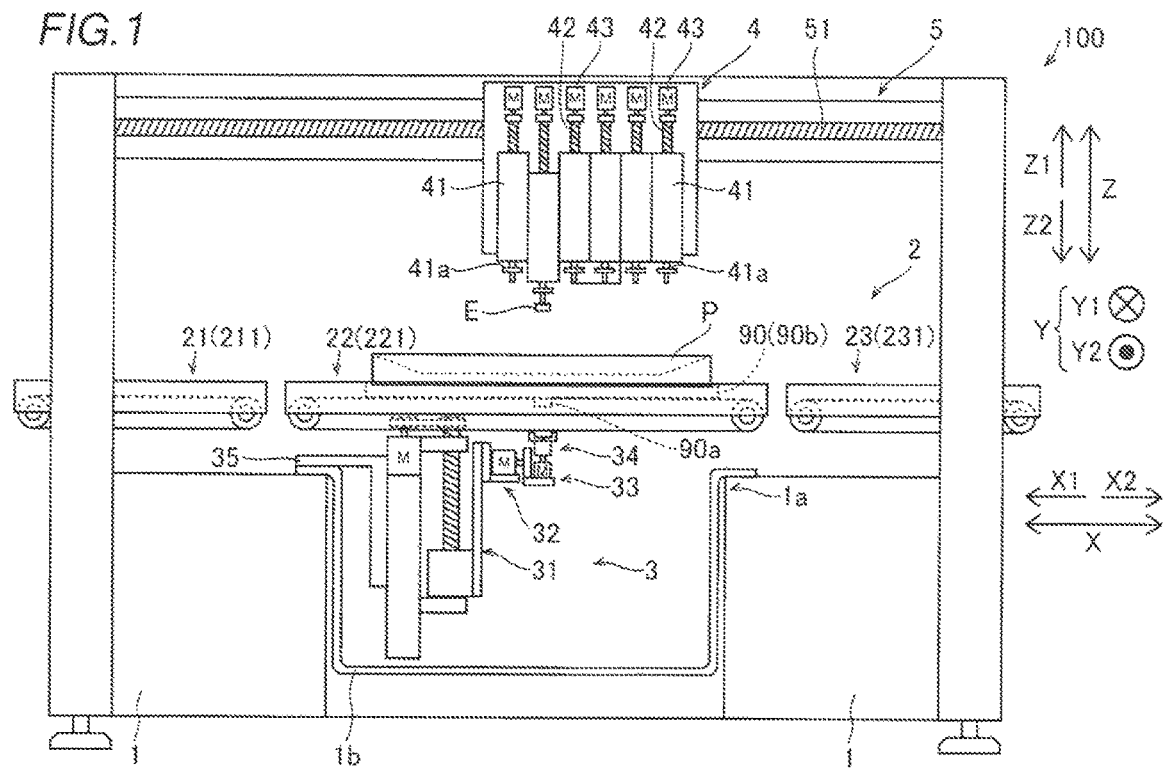
FIG. 1 is a schematic front view showing the overall configuration of a mounting target working device according to an embodiment of the present disclosure.
Figure 2:
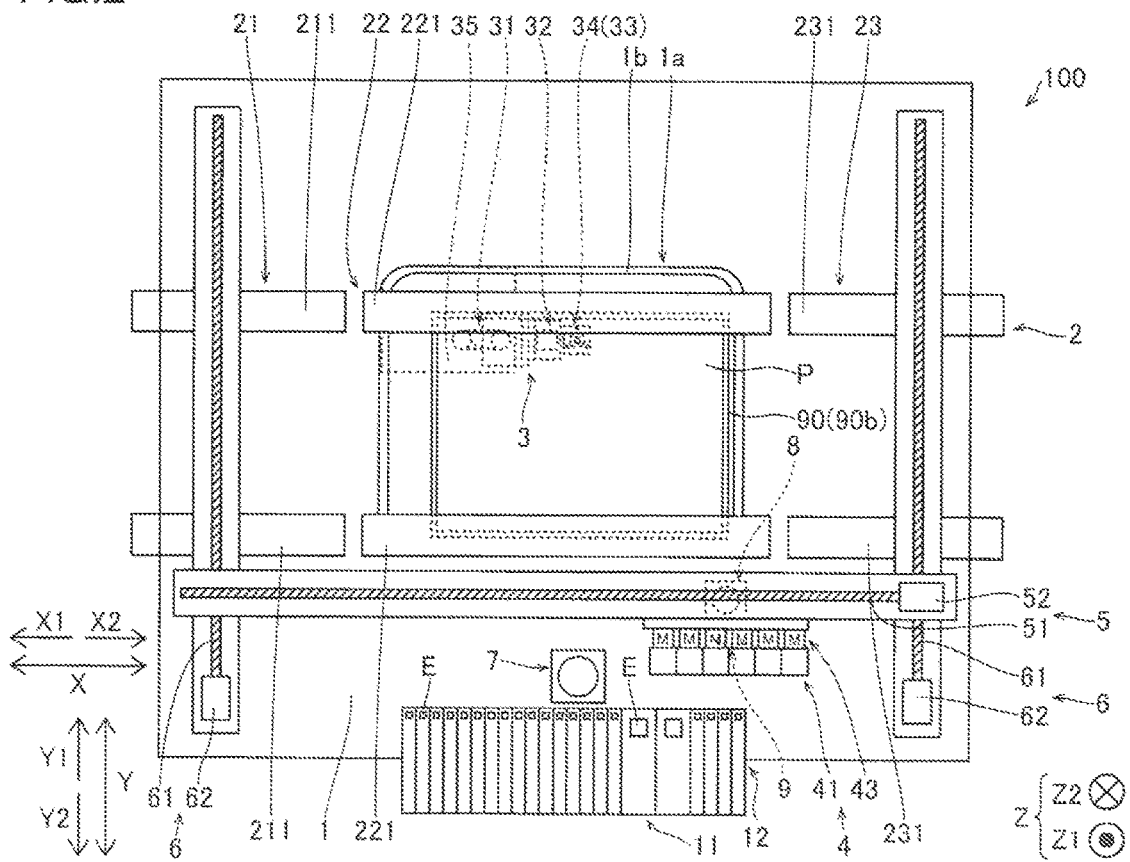
FIG. 2 is a schematic plan view showing the overall configuration of the mounting target working device according to the embodiment.
Figure 3:
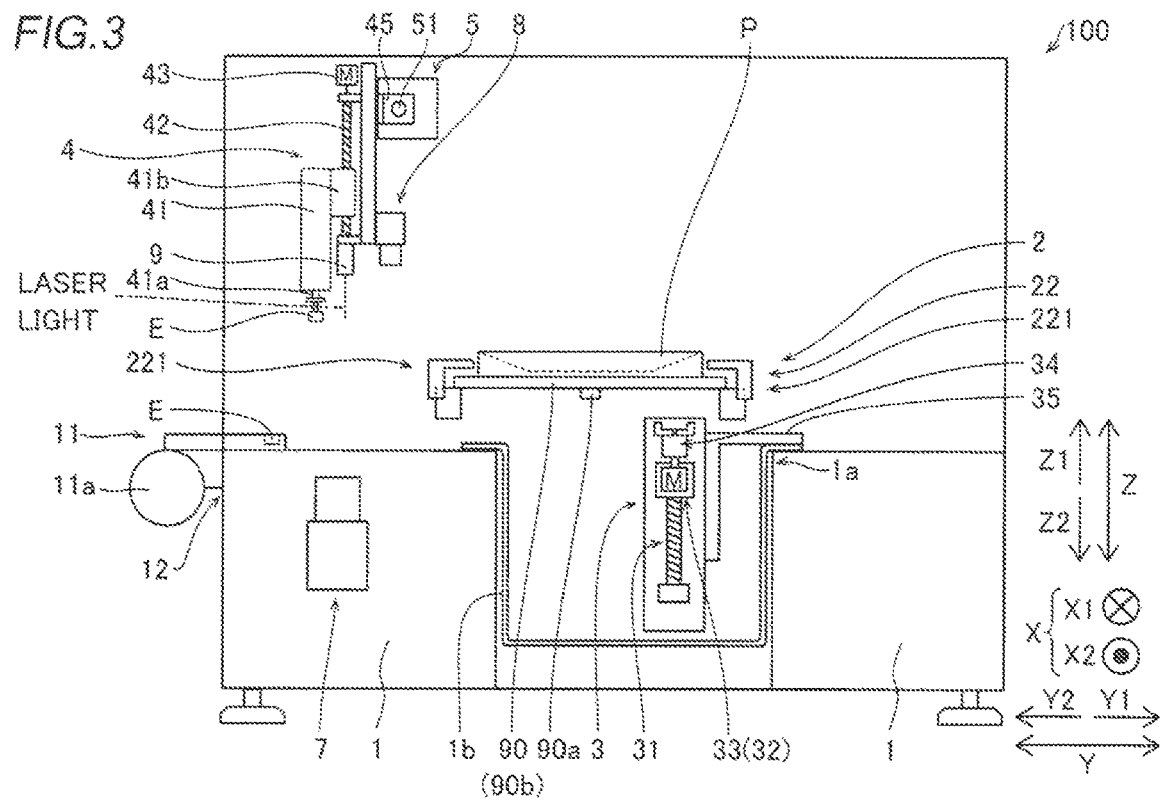
FIG. 3 is a schematic side view showing the overall configuration of the mounting target working device according to the embodiment.

As shown in FIGS. 1 to 3, the mounting target working device 100 is a component mounting device that mounts components E (electronic components) such as ICs, transistors, capacitors, and resistors on a mounting target P such as a printed circuit board.

Figure 4:
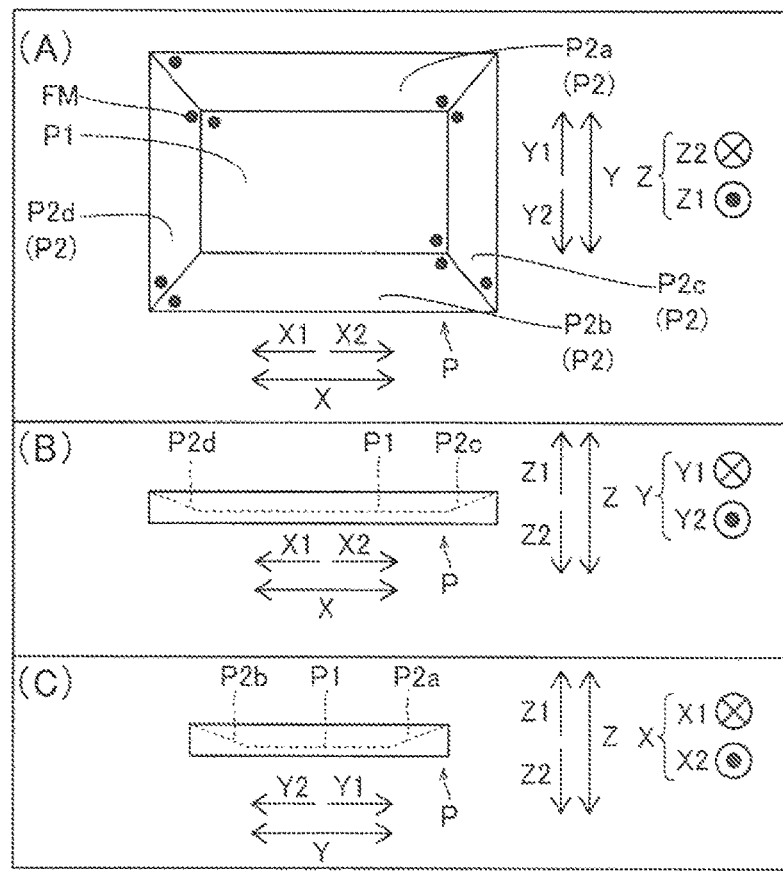
FIG. 4 is a diagram showing a mounting target on which the mounting target working device according to the embodiment performs work, in which Section (A) is a schematic plan view showing the mounting target, Section (B) is a schematic front view showing the mounting target, and Section (C) is a schematic side view showing the mounting target.
Figure 5:
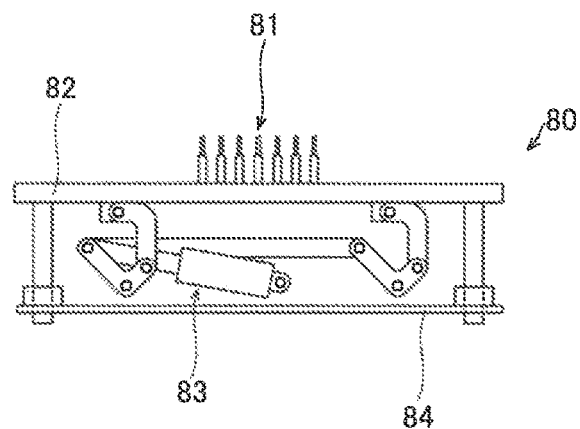
FIG. 5 is a schematic front view showing a substrate backup unit of the mounting target working device according to the embodiment.

As shown in FIG. 4, the mounting target P has one horizontal work target surface (horizontal mounting target surface) P1 and a plurality of (four) tilted work target surfaces (tilted mounting target surfaces) P2 tilted with respect to the horizontal work target surface P1. The plurality of tilted work target surfaces P2 include a pair of tilted work target surfaces P2a and P2b provided on both sides of the horizontal work target surface P1 in a direction Y and a pair of tilted work target surfaces P2c and P2d provided on both sides of the horizontal work target surface P1 in a direction X. The tilted work target surfaces P2a, P2b, P2c, and P2d are tilted downward to the horizontal work target surface P1. That is, the mounting target P has such a shape that the horizontal work target surface P1 is recessed downward with respect to the tilted work target surfaces P2a, P2b, P2c, and P2d that surround the periphery of the horizontal work target surface P1.

Position recognition marks (fiducial marks) FM (indicated by black circles) to be imaged by a substrate recognition camera 8 described later are attached to each of the horizontal work target surface P1 and the plurality of tilted work target surfaces P2. Both the single horizontal work target surface P1 and the plurality of tilted work target surfaces P2 are flat surfaces on which the components E are mounted by a head unit 4 described later. The horizontal work target surface P1 is a work target surface of the mounting target P substantially parallel to a horizontal plane (X-Y plane) in a conveying state in a conveyance direction (direction X) by a mounting target conveyance portion 2 described later.

As shown in FIGS. 1 to 3, the mounting target working device 100 is a device that conveys the mounting target P having the horizontal work target surface P1 and the tilted work target surfaces P2 and mounts the components E on the mounting target P. The mounting target working device 100 includes a base 1, the mounting target conveyance portion 2, a mounting target holding unit 3, the head unit 4, a support 5, a pair of rails 6, a component recognition camera 7, the substrate recognition camera 8, a height measurement portion 9, and a controller 10 (see FIG. 6). The head unit 4 is an example of a "working portion" in the claims.

A feeder arrangement portion 12 for arranging a plurality of tape feeders 11 is provided at an end of the base 1 on a Y2 side. The feeder arrangement portion 12 is not provided at an end of the base 1 on a Y1 side, and the tape feeders 11 are not disposed at the end of the base 1 on the Y1 side.

The tape feeders 11 hold reels 11a (see FIG. 3) on which tapes that hold a plurality of components E at a predetermined interval are wound. The tape feeders 11 are configured to feed the components E from the tips of the tape feeders 11 by rotating the reels 11a to feed the tapes that hold the components E.

The respective tape feeders 11 are placed in the feeder arrangement portion 12 in a state where the tape feeders 11 are electrically connected to the controller 10 via connectors (not shown) provided in the feeder arrangement portion 12. Thus, the respective tape feeders 11 are configured to feed the tapes from the reels 11a and feed the components E based on a control signal from the controller 10. At this time, the respective tape feeders 11 are configured to feed the components E according to the mounting operation of the head unit 4.

The mounting target conveyance portion 2 is configured to carry in the mounting target P, convey the mounting target P in the conveyance direction (direction X), and carry out the mounting target P. Furthermore, the mounting target conveyance portion 2 is configured to deliver the carried-in mounting target P to the mounting target holding unit 3. In the mounting target working device 100, a single conveyance path is formed by the mounting target conveyance portion 2.

As shown in FIGS. 1 to 3, the mounting target P is conveyed by the mounting target conveyance portion 2 while being held by a placement member 90. The placement member 90 is a member for conveying the mounting target P. The placement member 90 is provided with a plate-like placement portion 90b. A slightly adhesive adhesion layer is formed on the upper surface (the surface on a Z1 side) of the plate-like placement portion 90b. The mounting target P adheres to the adhesion layer such that the placement portion 90b detachably holds and fixes the mounting target P on its upper surface. Furthermore, a single held portion 90a to be held by the mounting target holding unit 3 is provided on the lower surface (the surface on a Z2 side) of the placement portion 90b. The held portion 90a is provided in the vicinity of the center of gravity position of the mounting target P held on the upper surface of the placement portion 90b. The held portion 90a protrudes downward (in a direction Z2) from the lower surface of the placement portion 90b. The mounting target P is held by the mounting target holding unit 3 via the placement member 90 (placement portion 90b).

The mounting target conveyance portion 2 includes an upstream conveyance portion 21, a central conveyance portion 22, and a downstream conveyance portion 23. The upstream conveyance portion 21 is a conveyance portion provided upstream (on an X1 side) in the conveyance direction (direction X). The upstream conveyance portion 21 is configured to carry in the mounting target P before mounting from a conveyance path (not shown) and convey the carried-in mounting target P to the central conveyance portion 22. The upstream conveyance portion 21 includes a pair of conveyors 211. The upstream conveyance portion 21 is configured to support both ends of the placement member 90 in a direction (direction Y) perpendicular to the conveyance direction from below by the pair of conveyors 211 so as to convey the mounting target P in the conveyance direction while supporting the mounting target P from both sides in the direction perpendicular to the conveyance direction. The pair of conveyors 211 are configured to be capable of adjusting an interval in the direction perpendicular to the conveyance direction. Specifically, a conveyor 211 on the Y1 side is movable in the direction perpendicular to the conveyance direction, and a conveyor 211 on the Y2 side is fixed. Thus, a width (a width in the direction Y) between the pair of conveyors 211 can be adjusted according to the size (the width in the direction Y) of the mounting target P.

The central conveyance portion 22 is a conveyance portion provided between the upstream conveyance portion 21 and the downstream conveyance portion 23. The central conveyance portion 22 is configured to receive the mounting target P before mounting from the upstream conveyance portion 21 and convey the received mounting target P to the downstream conveyance portion 23. Furthermore, the central conveyance portion 22 is configured to move the mounting target P to a position where the mounting target P is delivered to the mounting target holding unit 3.

The central conveyance portion 22 includes a pair of conveyors 221. The central conveyance portion 22 is configured to support both ends of the placement member 90 in the direction (direction Y) perpendicular to the conveyance direction from below by the pair of conveyors 221 so as to convey the mounting target P in the conveyance direction while supporting the mounting target P from both sides in the direction perpendicular to the conveyance direction. The pair of conveyors 221 are movable independently of each other in the direction perpendicular to the conveyance direction by a drive motor (not shown). The central conveyance portion 22 is configured to move the mounting target P in the direction perpendicular to the conveyance direction by moving the pair of conveyors 221 in the direction perpendicular to the conveyance direction while maintaining a width (a width in the direction Y) between the pair of conveyors 221.

In the mounting target working device 100, the carried-in mounting target P is moved (conveyed) in the conveyance direction (direction X) by the pair of conveyors 221 of the central conveyance portion 22, and is positioned at a predetermined location in the conveyance direction. Thereafter, the mounting target P is moved in the direction perpendicular to the conveyance direction by the pair of conveyors 221, and is positioned at a predetermined location in the direction perpendicular to the conveyance direction. Thus, in the mounting target working device 100, the mounting target P is moved to the delivery position where the mounting target P is delivered to the mounting target holding unit 3.

The downstream conveyance portion 23 is a conveyance portion provided downstream (on an X2 side) in the conveyance direction (direction X). The downstream conveyance portion 23 is configured to receive the mounting target P after mounting from the central conveyance portion 22 and carry out the mounting target P after mounting to a conveyance path (not shown). The downstream conveyance portion 23 includes a pair of conveyors 231. The downstream conveyance portion 23 is configured to support both ends of the placement member 90 in the direction (direction Y) perpendicular to the conveyance direction from below by the pair of conveyors 231 so as to convey the mounting target P in the conveyance direction while supporting the mounting target P from both sides in the direction perpendicular to the conveyance direction. The pair of conveyors 231 are configured to be capable of adjusting an interval in the direction perpendicular to the conveyance direction. Specifically, a conveyor 231 on the Y1 side is movable in the direction perpendicular to the conveyance direction, and a conveyor 231 on the Y2 side is fixed. Thus, a width (a width in the direction Y) between the pair of conveyors 231 can be adjusted according to the size (the width in the direction Y) of the mounting target P.

The mounting target holding unit 3 is configured to receive the mounting target P from the mounting target conveyance portion 2 at the delivery position and hold the mounting target P. Specifically, the mounting target holding unit 3 is configured to hold the mounting target P via the placement member 90 (placement portion 90b).

The mounting target holding unit 3 is configured to move the held mounting target P in an upward-downward direction (direction Z). In addition, the mounting target holding unit 3 is configured to tilt the held mounting target P. Furthermore, the mounting target holding unit 3 is configured to rotate the held mounting target P. The mounting target holding unit 3 is configured to be capable of adjusting the orientation of the mounting target P by moving the mounting target P in the upward-downward direction, tilting the mounting target P, or rotating the mounting target P. Thus, the orientation of the mounting target P can be adjusted such that the tilted work target surfaces P2 (see FIG. 4) of the mounting target P are substantially parallel to the horizontal plane (X-Y plane), for example. Furthermore, the orientation of the mounting target P can be adjusted such that the horizontal work target surface P1 (see FIG. 4) of the mounting target P is substantially parallel to the horizontal plane (X-Y plane), for example. The detailed configuration of the mounting target holding unit 3 is described later.

An opening 1a having a rectangular shape in a planar view is provided at a central portion of the base 1. A storage 1b having a concave shape recessed downward (in the direction Z2) from the upper surface (the surface on the Z1 side) of the base 1 is attached to the opening 1a of the base 1. At least a portion of the mounting target holding unit 3 is housed in the storage 1b. Thus, at least a portion of the mounting target holding unit 3 is disposed below the upper surface of the base 1. Consequently, as compared with the case where the mounting target holding unit 3 is disposed above the upper surface of the base 1, it is possible to significantly reduce or prevent an increase in the size of the mounting target working device 100 in the upward-downward direction.

The mounting target working device 100 is configured such that the mounting target holding unit 3 can be replaced with another unit. Specifically, the mounting target working device 100 is configured such that the mounting target holding unit 3 can be replaced with a mounting target backup unit 80 shown in FIG. 5.

The mounting target backup unit 80 is a unit that supports a flat plate-like mounting target (not shown) from below (direction Z2). The mounting target backup unit 80 includes a plurality of backup pins 81, a backup plate 82, and an air cylinder 83. In the mounting target backup unit 80, the backup plate 82 is moved in the upward-downward direction by the air cylinder 83 such that the flat plate-like mounting target is supported from below by the plurality of backup pins 81 fixed on the backup plate 82. When the mounting target backup unit 80 is used in the mounting target working device 100, a flat plate-like attachment member 84 is attached to the opening 1a of the base 1 in a state where the mounting target holding unit 3 and the storage 1b are detached, and the mounting target backup unit 80 is attached to the attachment member 84.

Therefore, when the mounting target holding unit 3 is attached, the mounting target working device 100 is a device suitable for mounting the components E on the mounting target P having the horizontal work target surface P1 and the tilted work target surfaces P2, as shown in FIG. 4, for example. When the mounting target backup unit 80 is attached, the mounting target working device 100 is a device suitable for mounting the components E on the flat plate-like mounting target.

As shown in FIGS. 1 to 3, the head unit 4 is provided above the base 1 via the support 5 and the pair of rails 6. Furthermore, the head unit 4 is provided above (direction Z1) the mounting target conveyance portion 2, the mounting target holding unit 3, and the tape feeders 11, and is movable in a horizontal direction.

The head unit 4 is configured to mount the components E on the mounting target P held by the mounting target holding unit 3 when the mounting target holding unit 3 is attached. Furthermore, the head unit 4 is configured to mount the components E on the mounting target (flat plate-like mounting target) supported by the mounting target backup unit 80 when the mounting target backup unit 80 is attached. Specifically, the head unit 4 is configured to suction the components E fed from the tape feeders 11 and mount the suctioned components E on the mounting target P.

The head unit 4 includes a plurality of (six) mounting heads 41, a plurality of (six) ball screw shafts 42 respectively provided on the mounting heads 41, a plurality of (six) Z-axis motors 43 respectively provided on the ball screw shafts 42, and a plurality of (six) R-axis motors 44 (see FIG. 6) respectively provided on the mounting heads 41. The mounting heads 41 are examples of a "working head" in the claims.

The plurality of mounting heads 41 are linearly arranged along the conveyance direction (direction X). Nozzles 41a (see FIGS. 1 and 3) are respectively attached to the tips of the mounting heads 41. The mounting heads 41 are configured to be capable of suctioning and holding the components E fed from the tape feeders 11 by a negative pressure generated at the tips of the nozzles 41a by a negative pressure generator (not shown).

Each of the ball screw shafts 42 extends in the upward-downward direction. Each of the Z-axis motors 43 is configured to rotate a corresponding ball screw shaft 42. Each of the mounting heads 41 is provided with a ball nut 41b (see FIG. 3) that engages with a corresponding ball screw shaft 42 (into which the corresponding ball screw shaft 42 is screwed). The ball screw shafts 42 are rotated by the Z-axis motors 43 such that the mounting heads 41 are movable in the upward-downward direction along the ball screw shafts 42 together with the ball nuts 41b that engage with the ball screw shafts 42 (into which the ball screw shafts 42 are screwed). Thus, the mounting heads 41 are movable in the upward-downward direction between lowered height positions where the components E can be suctioned and mounted, for example, and raised height positions where the mounting heads 41 can move in the horizontal direction. Each of the R-axis motors 44 is configured to rotate a corresponding mounting head 41 about the central axis of the nozzle 41a (about the direction Z).

The support 5 is configured to move the head unit 4 in the conveyance direction (direction X). The support 5 includes a ball screw shaft 51 that extends in the direction X, an X-axis motor 52 that rotates the ball screw shaft 51, and a guide rail (not shown) that extends in the direction X. The head unit 4 is provided with a ball nut 45 (see FIG. 3) that engages with the ball screw shaft 51 (into which the ball screw shaft 51 is screwed). The ball screw shaft 51 is rotated by the X-axis motor 52 such that the head unit 4 is movable in the conveyance direction (direction X) along the support 5 together with the ball nut 45 that engages with the ball screw shaft 51 (into which the ball screw shaft 51 is screwed).

The pair of rails 6 extend in the direction Y, and are fixed on the base 1 at both ends of the base 1 in the direction X. In addition, the pair of rails 6 are configured to move the support 5 in the direction (direction Y) perpendicular to the conveyance direction. The pair of rails 6 include a pair of ball screw shafts 61 that extend in the direction Y and a plurality of (two) Y-axis motors 62 respectively provided on the ball screw shafts 61. Each of the Y-axis motors 62 is configured to rotate a corresponding ball screw shaft 61. The support 5 is provided with ball nuts (not shown) that engage with the ball screw shafts 61 (in which the ball screw shafts 61 are screwed). The ball screw shafts 61 are synchronously rotated by the Y-axis motors 62, respectively, such that the support 5 is movable in the direction (direction Y) perpendicular to the conveyance direction along the pair of rails 6 together with the ball nuts that engage with the ball screw shafts 61 (into which the ball screw shafts 61 are screwed).

With this configuration, the head unit 4 is movable in the horizontal direction (directions X and Y) above the base 1. Thus, the head unit 4 can move above the tape feeders 11, for example, and suction the components E fed from the tape feeders 11. Furthermore, the head unit 4 can move above the mounting target P held by the mounting target holding unit 3, for example, and mount the suctioned components E on the mounting target P.

The component recognition camera 7 is fixed on the upper surface of the base 1 in the vicinity of the tape feeders 11, and is configured to image the components E suctioned by the nozzles 41a of the mounting heads 41 prior to mounting of the components E. The component recognition camera 7 is configured to image the components E suctioned by the nozzles 41a of the mounting heads 41 from below (direction Z2). These imaging results are acquired by the controller 10. The controller 10 is configured to recognize the suction states (the rotational orientations and the suction positions with respect to the nozzles 41a of the mounting heads 41) of the components E as viewed from below based on the imaging results of the components E suctioned by the nozzles 41a of the mounting heads 41. In addition, the controller 10 is configured to correct the rotational orientations of the components E and component mounting coordinate positions (X-Y coordinate positions) at the time of mounting, based on the recognition results of the suction states of the components E.

The substrate recognition camera 8 is configured to image the position recognition marks FM attached to the mounting target P prior to mounting of the components E. The position recognition marks FM are marks for recognizing the position of the mounting target P. These imaging results of the position recognition marks FM are acquired by the controller 10. The controller 10 is configured to recognize the accurate position and orientation of the mounting target P held by the mounting target holding unit 3 based on the imaging results of the position recognition marks FM. In addition, the controller 10 is configured to correct the component mounting coordinate positions (X-Y coordinate positions) at the time of mounting, based on the recognition results of the position and orientation of the mounting target P.

The substrate recognition camera 8 is attached to the head unit 4. Specifically, the substrate recognition camera 8 is attached at the center of the array of the nozzles aligned in the direction X on the Y1 side of the head unit 4. Thus, the substrate recognition camera 8 is movable in the horizontal direction (directions X and Y) above the base 1 together with the head unit 4. Furthermore, the substrate recognition camera 8 is configured to move in the horizontal direction above the base 1 and image the position recognition marks FM attached to the mounting target P from above (direction Z1).

The height measurement portion 9 includes a laser displacement meter that measures the heights of component mounting positions on the mounting target P prior to mounting of the components E. The height measurement portion 9 is configured to irradiate the component mounting positions on the mounting target P with laser light and receive reflected light reflected from the component mounting positions so as to measure the heights of the component mounting positions on the mounting target P. These height measurement results are acquired by the controller 10. The controller 10 is configured to recognize the heights of the component mounting positions on the mounting target P based on the height measurement results. In addition, the controller 10 is configured to correct the lowering amounts of the mounting heads 41 at the time of mounting, based on the recognition results of the heights of the component mounting positions on the mounting target P.

The height measurement portion 9 is attached to the head unit 4. Specifically, the height measurement portion 9 is attached at a substantially central position of the array of the mounting nozzles aligned in the direction X between the mounting heads 41 and the substrate recognition camera 8. Thus, the height measurement portion 9 is movable in the horizontal direction (directions X and Y) above the base 1 together with the head unit 4. The height measurement portion 9 is configured to move in the horizontal direction above the base 1 and irradiate the component mounting positions on the mounting target P with the laser light from above.

Figure 6:
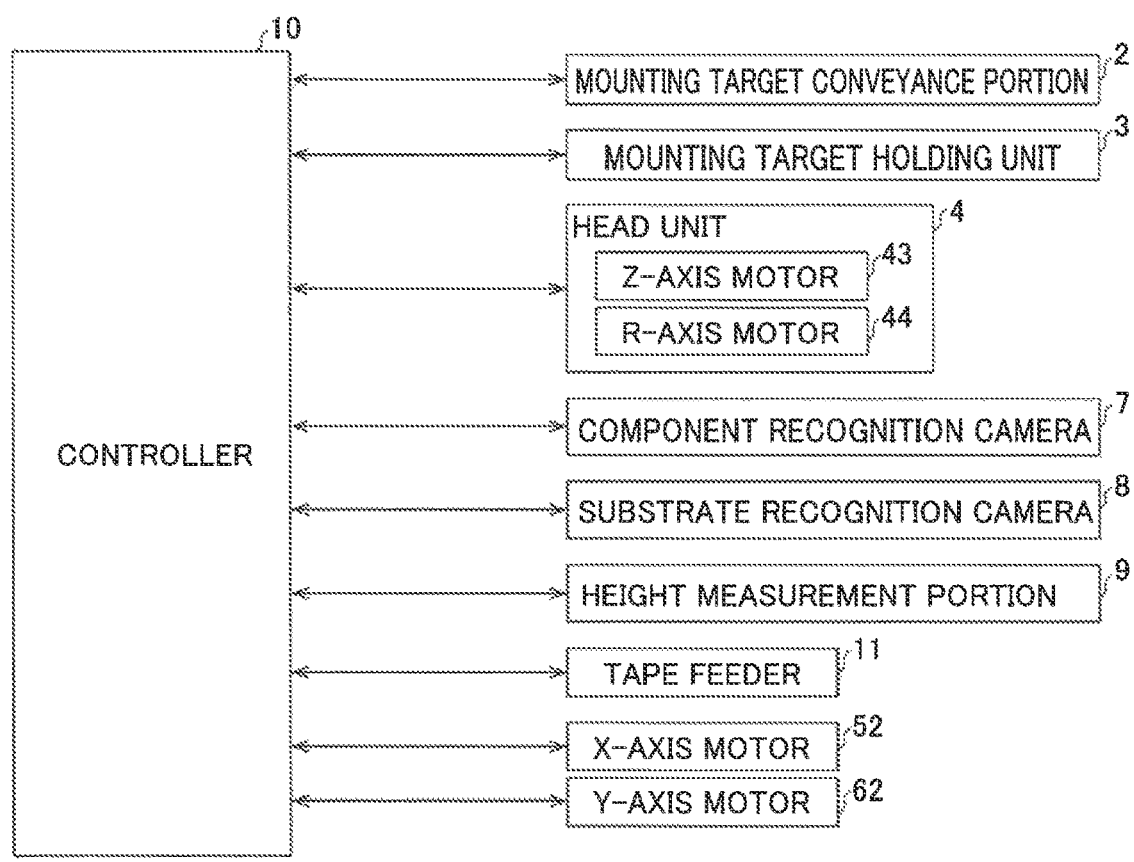
FIG. 6 is a block diagram showing the control configuration of the mounting target working device according to the embodiment.

As shown in FIG. 6, the controller 10 includes a CPU (Central Processing Unit), a ROM (Read Only Memory), a RAM (Random Access Memory), etc., and is configured to control the operation of the mounting target working device 100. Specifically, the controller 10 is configured to control the mounting target conveyance portion 2, the mounting target holding unit 3, the head unit 4, the support 5, the pair of rails 6, the component recognition camera 7, the substrate recognition camera 8, the height measurement portion 9, the tape feeders 11, etc. according to programs stored in advance to mount the components E on the mounting target P.

(Configuration of Mounting Target Holding Unit)

Figure 7:
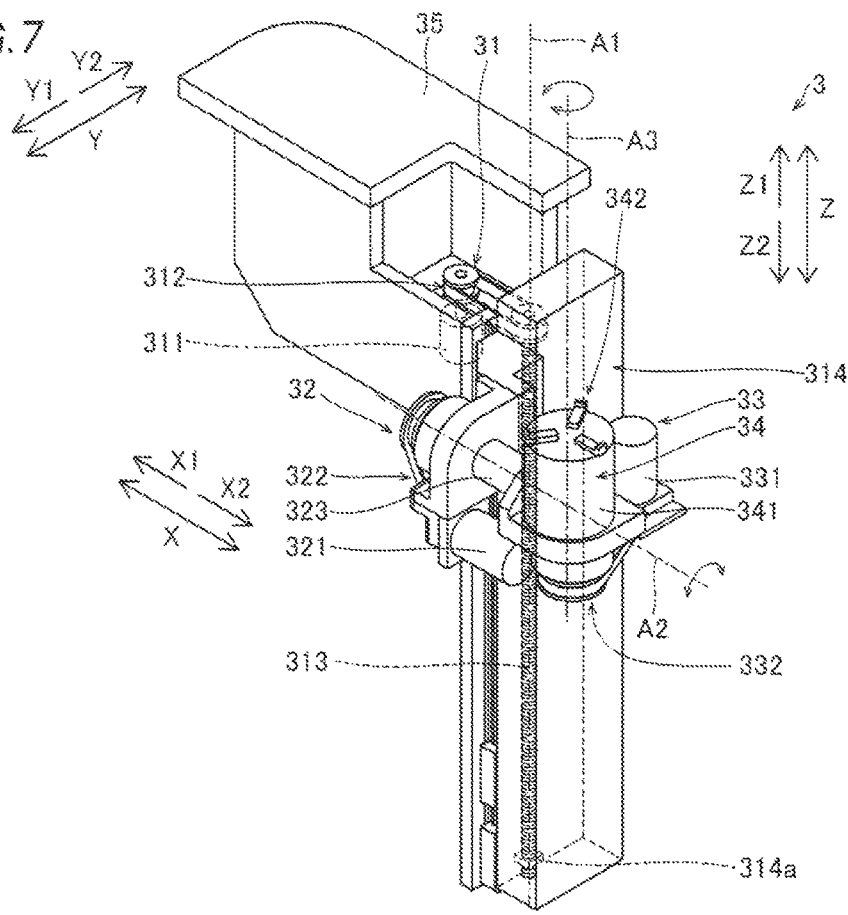
FIG. 7 is a perspective view showing a mounting target holding unit of the mounting target working device according to the embodiment.

Next, the detailed configuration of the mounting target holding unit 3 is described with reference to FIGS. 7 to 10. As shown in FIGS. 7 to 10, the mounting target holding unit 3 includes a lift mechanism 31, a tilt mechanism 32, a rotation mechanism 33, a holding portion 34, and a fixing portion 35. In FIGS. 1 to 3, 11, and 12, the mounting target holding unit 3 shown in FIG. 7 is shown in a simplified manner.

The lift mechanism 31 is an up-down axis mechanism that moves the mounting target P held by the holding portion 34 in the upward-downward direction along an axis A1 (indicated by a one-dot chain line) that extends in the upward-downward direction. The lift mechanism 31 includes a drive motor 311, a belt pulley mechanism 312, a ball screw shaft 313, and an attachment portion 314.

The drive motor 311 is configured to generate a drive force for rotating the ball screw shaft 313. The belt pulley mechanism 312 is configured to transmit the drive force (rotational force) generated by the drive motor 311 to the ball screw shaft 313. The ball screw shaft 313 is configured to rotate about the axis A1 due to the drive force of the drive motor 311 transmitted via the belt pulley mechanism 312. The axis A1 is an axis that passes through the center of the ball screw shaft 313.

The attachment portion 314 is a member that attaches the tilt mechanism 32, the rotation mechanism 33, and the holding portion 34 to the lift mechanism 31. Specifically, the tilt mechanism 32 is attached on the Y1 side of the attachment portion 314. The rotation mechanism 33 and the holding portion 34 are attached on the X2 side of the tilt mechanism 32. That is, the tilt mechanism 32 is attached to the attachment portion 314, and the rotation mechanism 33 and the holding portion 34 are attached to the attachment portion 314 via the tilt mechanism 32. Furthermore, a ball nut 314a that engages with the ball screw shaft 313 (into which the ball screw shaft 313 is screwed) is provided in the attachment portion 314.

The ball screw shaft 313 is rotated by the drive motor 311 such that the attachment portion 314 is movable in the upward-downward direction along the ball screw shaft 313 together with the ball nut 314a that engages with the ball screw shaft 313 (into which the ball screw shaft 313 is screwed). Thus, the lift mechanism 31 is configured to move the tilt mechanism 32, the rotation mechanism 33, the holding portion 34, and the mounting target P held by the holding portion 34 together with the attachment portion 314 in the upward-downward direction (direction Z). FIGS. 7 to 10 show a state where the attachment portion 314 is disposed at the lower end.

The tilt mechanism 32 is attached to the lift mechanism 31, and is a tilt axis mechanism that tilts the mounting target P held by the holding portion 34 by rotating the mounting target P about an axis A2 (indicated by a one-dot chain line). The axis A2 is an axis that extends in the horizontal direction. According the present embodiment, the axis A2 is an axis that extends in a direction substantially parallel to the conveyance direction, and is an axis that extends in a direction substantially perpendicular to the attachment direction (direction Y) of the tilt mechanism 32 with respect to the lift mechanism 31 and the axis A1. Furthermore, the axis A2 is an axis that extends in a direction substantially parallel to the array direction (direction X) of the plurality of mounting heads 41. The axis A2 is an example of an "axis that extends in a direction substantially parallel to an array direction of the plurality of working heads" in the claims.

The tilt mechanism 32 includes a drive motor 321, a belt pulley mechanism 322, and a rotating shaft 323. The drive motor 321 is configured to generate a drive force for rotating the rotating shaft 323. In addition, the drive motor 321 is configured to be capable of forward rotation (clockwise rotation) and reverse rotation (counterclockwise rotation). The belt pulley mechanism 322 is configured to transmit the drive force (rotational force) generated by the drive motor 321 to the rotating shaft 323. The rotating shaft 323 is configured to rotate about the axis A2 due to the drive force of the drive motor 321 transmitted via the belt pulley mechanism 322. The axis A2 is an axis that passes through the center of the rotating shaft 323.

The rotation mechanism 33 and the holding portion 34 are attached to an end of the rotation shaft portion 323 on the X2 side. The rotating shaft 323 is rotated by the drive motor 321 such that the rotation mechanism 33 and the holding portion 34 are rotatable about the axis A2 together with the rotating shaft 323. Thus, the tilt mechanism 32 is configured to rotate the rotation mechanism 33, the holding portion 34, and the mounting target P held by the holding portion 34 about the axis A2 and tilt the same in a Y-Z plane (see FIGS. 10 and 11).

Specifically, the tilt mechanism 32 is configured to tilt the rotation mechanism 33, the holding portion 34, and the mounting target P held by the holding portion 34 from a reference state toward a Y1 direction side or a Y2 direction side perpendicular to the conveyance direction when a state where an axis A3 described later is substantially parallel to the upward-downward direction is taken as the reference state. In this case, the tilt mechanism 32 can tilt the rotation mechanism 33, the holding portion 34, and the mounting target P held by the holding portion 34 from the reference state toward each of the Y1 direction side and the Y2 direction side perpendicular to the conveyance direction in an angular range from 0 to 90 degrees.

The rotation mechanism 33 is attached to the tilt mechanism 32, and is a rotation axis mechanism that rotates the mounting target P held by the holding portion 34 about the axis A3 (indicated by a one-dot chain line). The axis A3 is an axis that extends in a direction substantially perpendicular to the axis A2. Furthermore, the axis A3 is an axis that passes through the center of the holding portion 34, and is also tilted when the rotation mechanism 33 and the holding portion 34 are tilted by the tilt mechanism 32. The rotation mechanism 33 includes a drive motor 331 and a belt pulley mechanism 332.

The drive motor 331 is configured to generate a drive force for rotating the holding portion 34. Furthermore, the drive motor 331 is configured to be capable of forward rotation (clockwise rotation) and reverse rotation (counterclockwise rotation). The belt pulley mechanism 332 is configured to transmit the drive force (rotational force) generated by the drive motor 331 to the holding portion 34. The holding portion 34 is configured to rotate about the axis A3 due to the drive force of the drive motor 331 transmitted via the belt pulley mechanism 332. Thus, the rotation mechanism 33 is configured to rotate the mounting target P held by the holding portion 34 together with the holding portion 34 about the axis A3.

The holding portion 34 is attached to the rotation mechanism 33, and is configured to hold and fix the mounting target P via the placement member 90. The holding portion 34 includes a main body 341 having a cylindrical shape and a plurality of (three) claws 342. The plurality of (three) claws 342 are disposed at equal angular intervals (120-degree intervals) on the upper surface of the main body 341. Furthermore, each of the plurality of claws 342 is movable in the radial direction of rotation of the holding portion 34.

Specifically, when holding the held portion 90a (see FIGS. 1 to 3) of the placement member 90, the plurality of claws 342 each move on the upper surface of the main body 341 in a radial direction toward the rotational center of the holding portion 34 (i.e. in a direction toward the axis A3). Consequently, the held portion 90a of the placement member 90 is grasped by the plurality of claws 342, and the mounting target P is held and fixed by the mounting target holding unit 3 via the placement member 90.

When releasing holding of the held portion 90a of the placement member 90, the plurality of claws 342 each move on the upper surface of the main body 341 in a radial direction away from the rotational center of the holding portion 34 (i.e. in a direction away from the axis A3). Consequently, grasping of the held portion 90a of the placement member 90 by the plurality of claws 342 is released, and holding of the mounting target P via the placement member 90 by the mounting target holding unit 3 is released.

The fixing portion 35 is a member that attaches and fixes the mounting target holding unit 3 to the base 1. As shown in FIGS. 1 to 3, the mounting target holding unit 3 is fixed to the base 1 via the fixing portion 35 by screws, for example. In addition, the mounting target holding unit 3 is fixed at a position where the holding portion 34 is shifted to the Y1 side with respect to the center of the single conveyance path formed by the mounting target conveyance portion 2.

According to the present embodiment, as shown in FIGS. 7 to 10, the rotation mechanism 33 is supported in a cantilever manner by the tilt mechanism 32. In addition, the tilt mechanism 32 is supported in a cantilever manner by the lift mechanism 31.

Specifically, the tilt mechanism 32 is attached on the Y1 side of the attachment portion 314 of the lift mechanism 31 so as to be supported in a cantilever manner by the lift mechanism 31 in the horizontal direction. That is, the tilt mechanism 32 is not supported by the lift mechanism 31 from one side (Y1 side) in the horizontal direction but is supported by the lift mechanism 31 from the other side (Y2 side) in the horizontal direction. The lift mechanism 31 and the tilt mechanism 32 are aligned in the direction Y of the horizontal direction.

The rotation mechanism 33 is attached to an end on the X2 side of the rotating shaft 323 of the tilt mechanism 32 so as to be supported in a cantilever manner by the tilt mechanism 32 in the horizontal direction. That is, the rotation mechanism 33 is not supported by the tilt mechanism 32 from one side (X2 side) in the horizontal direction but is supported by the tilt mechanism 32 from the other side (X1 side) in the horizontal direction. The tilt mechanism 32 and the rotation mechanism 33 are aligned in the direction X of the horizontal direction.

According to the present embodiment, the lift mechanism 31, the tilt mechanism 32, and the rotation mechanism 33 are disposed such that the attachment direction (the direction Y according to the present embodiment) of the tilt mechanism section 32 with respect to the lift mechanism 31 and the attachment direction (the direction X according to the present embodiment) of the rotation mechanism 33 with respect to the tilt mechanism 32 are substantially perpendicular to each other in the planar view (as viewed in the upward-downward direction). Thus, the attachment portion 314 of the lift mechanism 31, the tilt mechanism 32, and the rotation mechanism 33 are disposed so as to have a substantially L shape in the planar view. The direction Y is an example of a "first attachment direction" in the claims. The direction X is an example of a "second attachment direction" in the claims.

The lift mechanism 31, the tilt mechanism 32, and the rotation mechanism 33 are disposed at positions where the same do not overlap each other in the planar view. Furthermore, the rotation mechanism 33 is disposed on the side (X2 side) opposite to the side (X1 side) on which the drive motor 311 of the lift mechanism 31 is disposed with respect to the tilt mechanism 32.

Figure 8:
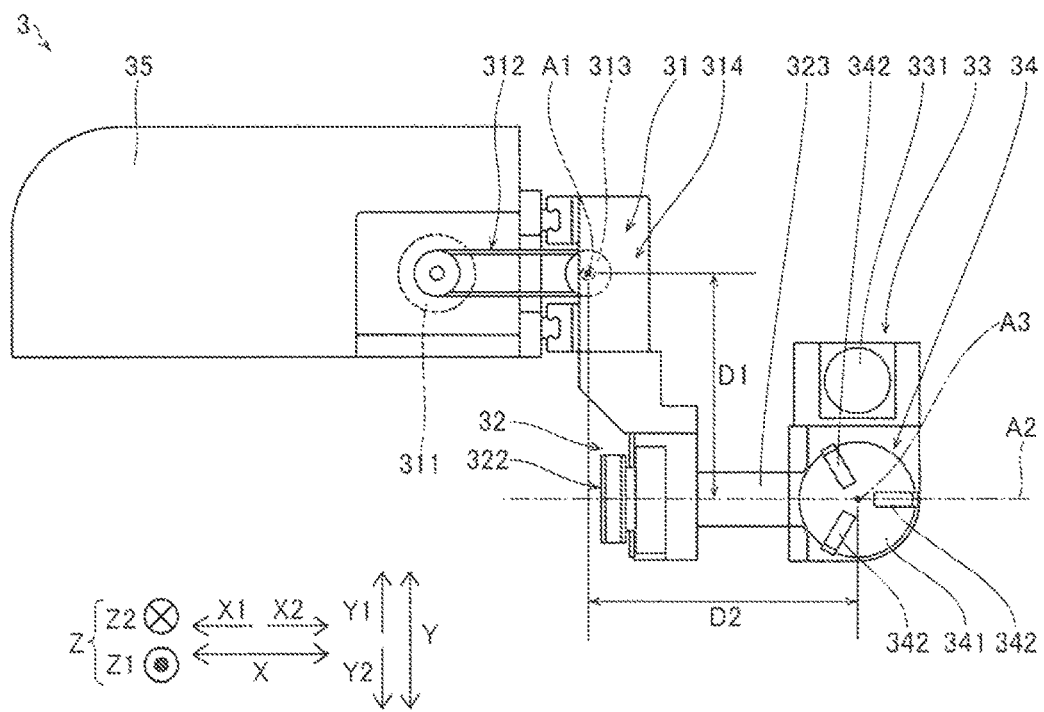
FIG. 8 is a plan view showing the mounting target holding unit of the mounting target working device according to the embodiment.
Figure 9:
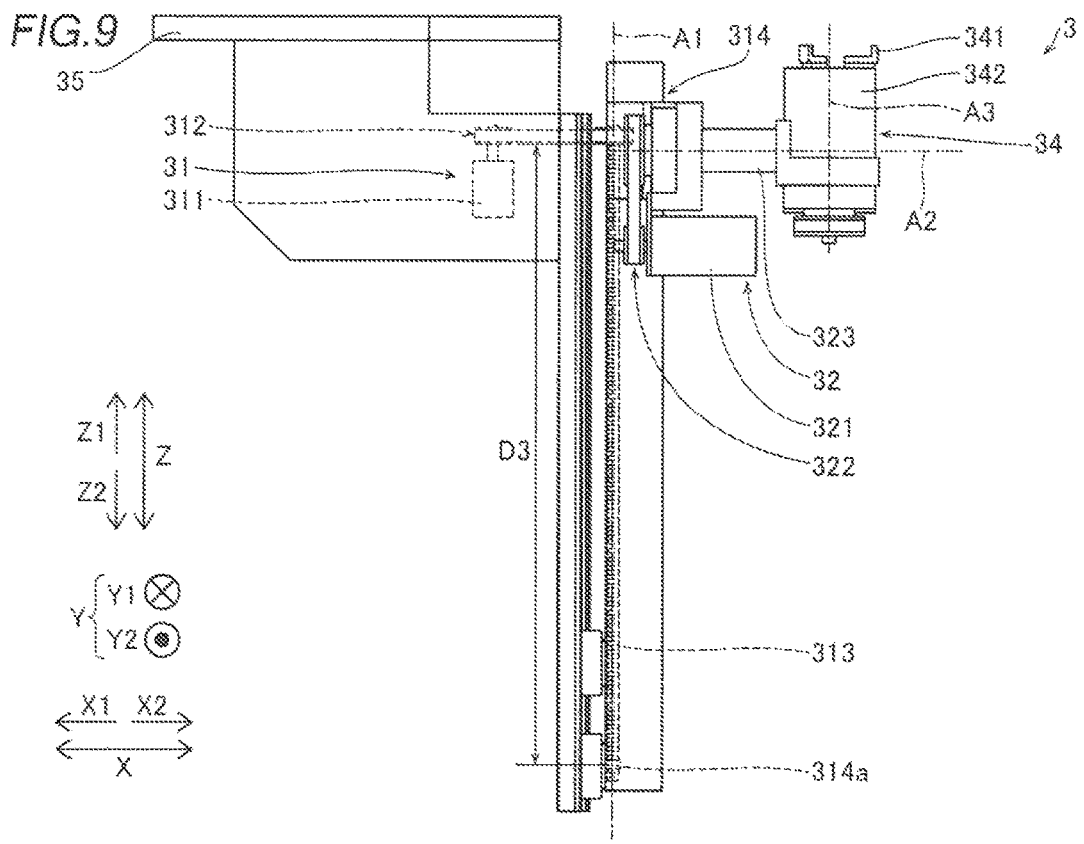
FIG. 9 is a front view showing the mounting target holding unit of the mounting target working device according to the embodiment.
Figure 10:
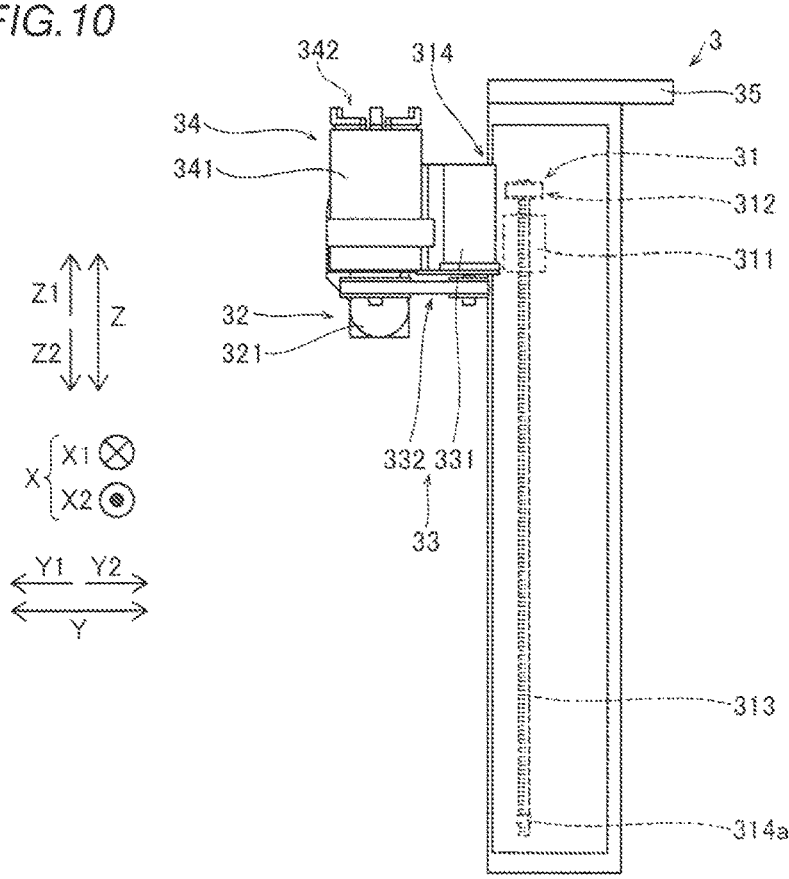
FIG. 10 is a side view showing the mounting target holding unit of the mounting target working device according to the embodiment.

According to the present embodiment, as viewed in the planar view, a distance between the axis A1 of the lift mechanism 31 and the axis A2 of the tilt mechanism 32 in the attachment direction (the direction Y according to the present embodiment) of the tilt mechanism 32 with respect to the lift mechanism 31 is D1 (see FIG. 8). The distance D1 is shorter than a distance D3 (see FIG. 9) that the lift mechanism 31 can move the mounting target P in the upward-downward direction. That is, the tilt mechanism 32 is attached sufficiently close to the lift mechanism 31. The distance D1 is an example of a "first distance" in the claims. The distance D3 is an example of a "second distance" in the claims.

As viewed in the planar view, a distance between the axis A1 of the lift mechanism 31 and the axis A3 of the rotation mechanism 33 in the attachment direction (the direction X according to the present embodiment) of the rotation mechanism 33 with respect to the tilt mechanism 32 is D2 (see FIG. 8). The distance D2 is shorter than the distance D3 (see FIG. 9) that the lift mechanism 31 can move the mounting target P in the upward-downward direction. That is, the rotation mechanism 33 is attached sufficiently close to the lift mechanism 31. The distance D2 is an example of a "third distance" in the claims.

(Configuration of Controller Involving Mounting Operation on Tilted Work Target Surface)

Figure 11:
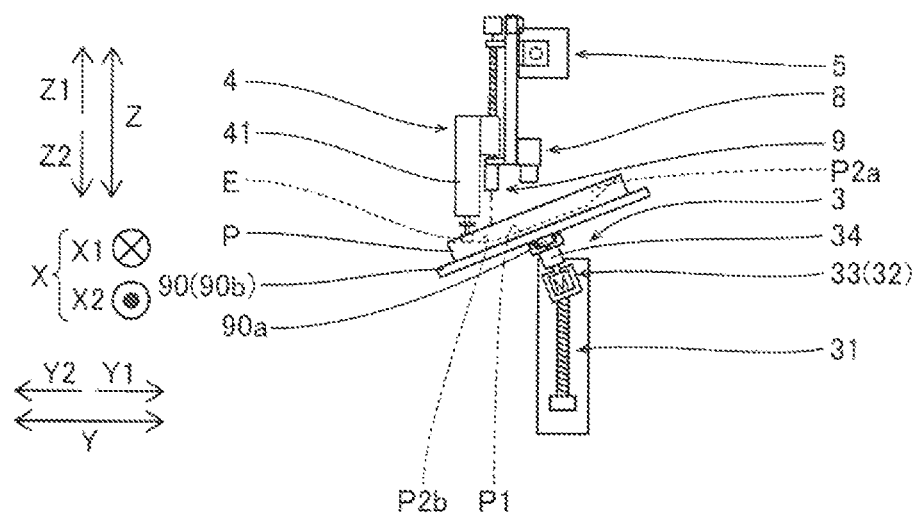
FIG. 11 is a diagram for illustrating a mounting operation on a tilted work target surface in the mounting target working device according to the embodiment.
Figure 12:
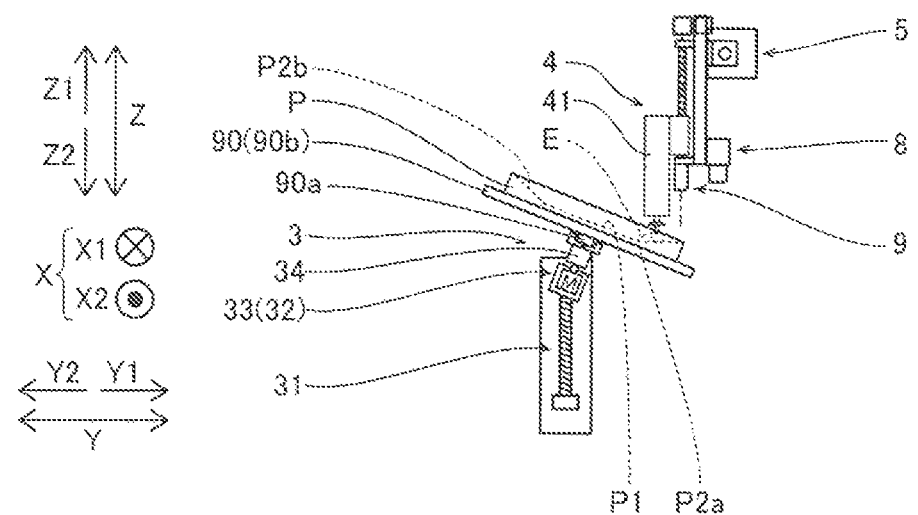
FIG. 12 is another diagram for illustrating a mounting operation on a tilted work target surface in the mounting target working device according to the embodiment.

As shown in FIGS. 11 and 12, the controller 10 is configured to control the mounting target holding unit 3 to tilt the mounting target P and to control the head unit 4 to mount the components E on the tilted work target surfaces P2 of the mounting target P. In this case, the controller 10 is configured to adjust the orientation of the mounting target P such that the tilted work target surfaces P2 (see FIG. 4) of the mounting target P are substantially parallel to the horizontal plane (X-Y plane) by controlling the lift mechanism 31 to move the mounting target P in the upward-downward direction, controlling the tilt mechanism 32 to tilt the mounting target P, or controlling the rotation mechanism 33 to rotate the mounting target P.

For example, as shown in FIG. 11, when a mounting operation is performed on the tilted work target surface P2b on the Y2 side of the plurality of (four) tilted work target surfaces P2, the controller 10 controls the mounting target holding unit 3 to adjust the orientation of the mounting target P such that the tilted work target surface P2b of the mounting target P is substantially parallel to the horizontal plane. Then, the controller 10 controls the head unit 4 to mount a component E in a state where the tilted work target surface P2b of the mounting target P is substantially parallel to the horizontal plane (X-Y plane).

For example, as shown in FIG. 12, when a mounting operation is performed on the tilted work target surface P2a on the Y1 side of the plurality of (four) tilted work target surfaces P2, the controller 10 controls the mounting target holding unit 3 to adjust the orientation of the mounting target P such that the tilted work target surface P2a of the mounting target P is substantially parallel to the horizontal plane. Then, the controller 10 controls the head unit 4 to mount a component E in a state where the tilted work target surface P2a of the mounting target P is substantially parallel to the horizontal plane (X-Y plane).

When controlling the head unit 4 to mount the component E, the controller 10 lowers, in advance, mounting heads 41 other than a mounting head 41 that mounts the component E on the mounting target P from the raised height positions where the mounting heads 41 can move in the horizontal direction to mounting standby height positions. The mounting standby height positions are higher than the lowered height positions where the components E can be suctioned and mounted, and are lower than the raised height positions where the mounting heads 41 can move in the horizontal direction.

(Processing for Mounting on Work Target Surface)

Next, processing for mounting on a work target surface (the horizontal work target surface P1 and the tilted work target surfaces P2) according to the present embodiment is described based on a flowchart with reference to FIG. 13. The processing for mounting on the work target surface is performed by the controller 10.

As shown in FIG. 13, first, the components E fed from the tape feeders 11 are suctioned by the mounting heads 41 of the head unit 4 in step S1.

The component recognition camera 7 images the suction states of the components E suctioned by the mounting heads 41 from below in step S2. Consequently, the suction states of the components E suctioned by the mounting heads 41 are recognized.

The mounting target holding unit 3 adjusts the work target surface (the horizontal work target surface P1 or the tilted work target surfaces P2) of the mounting target P, on which a mounting operation is performed, to be substantially parallel to the horizontal plane (X-Y plane) in step S3. Specifically, in step S3, the mounting target P held by the holding portion 34 of the mounting target holding unit 3 is moved in the upward-downward direction by the lift mechanism 31, is tilted by the tilt mechanism 32, or is rotated by the rotation mechanism 33. Thus, the work target surface (the horizontal work target surface P1 or the tilted work target surfaces P2) of the mounting target P, on which a mounting operation is performed, is adjusted to be substantially parallel to the horizontal plane (X-Y plane). When the work target surface of the mounting target P has already been substantially parallel to the horizontal plane, it is not necessary to perform the processing in step S3.

The mounting heads 41 that have suctioned the components E are raised to the raised height positions where the mounting heads 41 can move in the horizontal direction in step S4.

The head unit 4 is moved in the horizontal direction toward the mounting target P in step S5.

The substrate recognition camera 8 images the position recognition marks FM of the work target surface (the horizontal work target surface P1 or the tilted work target surfaces P2) of the mounting target P, on which a mounting operation is performed, in step S6. Consequently, the position of the mounting target P held by the mounting target holding unit 3 is recognized.

The height measurement portion 9 is moved to a position above the component mounting positions on the mounting target P in step S7.

The height measurement portion 9 measures the height of the work target surface (the horizontal work target surface P1 or the tilted work target surfaces P2) in step S8. Specifically, in step S8, the height measurement portion 9 measures the heights of the component mounting positions on the work target surface (the horizontal work target surface P1 or the tilted work target surfaces P2) of the mounting target P on which a mounting operation is performed.

The mounting heads 41 are moved to positions above the component mounting positions in step S9. Then, the components E are mounted at the component mounting positions on the mounting target P by the mounting heads 41 in step S10. At this time, the mounting heads 41 other than the mounting head 41 that mounts the component E on the mounting target P are lowered from the raised height positions where the mounting heads 41 can move in the horizontal direction to the mounting standby height positions.

In the processing in step S9 and step S10, the rotational orientations of the suctioned components E, the component mounting coordinate positions (X-Y coordinate positions) at the time of mounting, and the lowering amounts of the mounting heads 41 at the time of mounting are properly corrected based on the imaging results by the component recognition camera 7 in step S2, the imaging results by the substrate recognition camera 8 in step S6, and the measurement results by the height measurement portion 9 in step S8, and the components E are mounted. Then, the processing for mounting on the work target surface is terminated.

Effects of Present Embodiment

According to the present embodiment, the following effects can be obtained.

According to the present embodiment, as hereinabove described, the rotation mechanism 33 is supported in a cantilever manner by the tilt mechanism 32. Thus, the structure of the tilt mechanism 32 to support the rotation mechanism 33 can be simplified as compared with the case where the rotation mechanism 33 is supported from both sides by the tilt mechanism 32, and hence the mounting target holding unit 3 can be downsized. When the mounting target working device 100 is configured such that the mounting target holding unit 3 can be replaced with another unit (mounting target backup unit 80) as in the present embodiment, the mounting target holding unit 3 is preferably downsized. Therefore, in the case of the mounting target working device 100 according to the present embodiment, it is particularly effective that the mounting target holding unit 3 can be downsized.

According to the present embodiment, as hereinabove described, the tilt mechanism 32 is supported in a cantilever manner by the lift mechanism 31. Thus, in addition to the structure of the tilt mechanism 32 to support the rotation mechanism 33, the structure of the lift mechanism 31 to support the rotation mechanism 33 can be simplified, and hence the mounting target holding unit 3 can be further downsized.

According to the present embodiment, as hereinabove described, the tilt mechanism 32 is supported in a cantilever manner by the lift mechanism 31 in the horizontal direction. Furthermore, the rotation mechanism 33 is supported in a cantilever manner by the tilt mechanism 32 in the horizontal direction. Thus, both the tilt mechanism 32 and the rotation mechanism 33 are supported in a cantilever manner in the horizontal direction, and hence it is possible to significantly reduce or prevent an increase in the size of the mounting target holding unit 3 in the upward-downward direction.

According to the present embodiment, as hereinabove described, the lift mechanism 31, the tilt mechanism 32, and the rotation mechanism 33 are disposed such that the attachment direction (the direction Y according to the present embodiment) of the tilt mechanism 32 with respect to the lift mechanism 31 and the attachment direction (the direction X according to the present embodiment) of the rotation mechanism 33 with respect to the tilt mechanism 32 are substantially perpendicular to each other in the planar view. Thus, unlike the case where the attachment direction of the tilt mechanism 32 with respect to the lift mechanism 31 and the attachment direction of the rotation mechanism 33 with respect to the tilt mechanism 32 are substantially parallel to each other in the planar view, it is possible to significantly reduce or prevent an increase in the size of the mounting target holding unit 3 in one direction as viewed in the planar view.

According to the present embodiment, as hereinabove described, the distance D1 between the lift mechanism 31 and the tilt mechanism 32 in the attachment direction of the tilt mechanism 32 with respect to the lift mechanism 31 is shorter than the distance D3 that the lift mechanism 31 can move the mounting target P in the upward-downward direction. Furthermore, the distance D2 between the lift mechanism 31 and the rotation mechanism 33 in the attachment direction of the rotation mechanism 33 with respect to the tilt mechanism 32 is shorter than the distance D3 that the lift mechanism 31 can move the mounting target P in the upward-downward direction. Thus, the tilt mechanism 32 and the rotation mechanism 33 can be disposed in the vicinity of the lift mechanism 31, and hence even when the tilt mechanism 32 and the rotation mechanism 33 are supported in a cantilevered manner, the tilt mechanism 32 and the rotation mechanism 33 can be stably supported.

According to the present embodiment, as hereinabove described, the holding portion 34 of the mounting target holding unit 3 is configured to hold the mounting target P via the placement member 90 on which the mounting target P is placed. Thus, even when a held portion 90a held by the mounting target holding unit 3 is not provided on the mounting target P, the mounting target P can be held by the mounting target holding unit 3 via the placement member 90.

According to the present embodiment, as hereinabove described, the holding portion of the mounting target holding unit 3 is configured to hold the mounting target P via the placement portion 90b of the placement member 90 by grasping the single held portion 90a of the placement member 90. Thus, the mounting target P can be held simply by grasping the single held portion 90a with the mounting target holding unit 3, and hence the configuration of the mounting target holding unit 3 can be simplified as compared with the case where the mounting target holding unit 3 needs to grasp a plurality of held portions 90a.

According to the present embodiment, as hereinabove described, the tilt mechanism 32 of the mounting target holding unit 3 is configured to tilt the mounting target P by rotating the mounting target P about the axis A2 that extends in the direction substantially parallel to the array direction of the plurality of mounting heads 41. Thus, even when the mounting target P is tilted, it is possible to significantly reduce or prevent interference between the plurality of mounting heads 41 and the tilted mounting target P. Consequently, the plurality of mounting heads 41 can be brought closer to the mounting target P in advance, and hence the work time of the head unit 4 for the mounting target P can be reduced.

Modified Examples

The embodiment disclosed this time must be considered as illustrative in all points and not restrictive. The range of the present disclosure is shown not by the above description of the embodiment but by the scope of claims for patent, and all modifications (modified examples) within the meaning and range equivalent to the scope of claims for patent are further included.

For example, while the example in which the present disclosure is applied to the mounting target working device as a component mounting device that mounts components on a mounting target has been shown in the aforementioned embodiment, the present disclosure is not restricted to this. The present disclosure may be applied to a mounting target working device other than the component mounting device.

For example, the present disclosure may be applied to a mounting target working device as a viscous material application device that applies a viscous material such as solder to a mounting target. In this case, instead of the head unit according to the aforementioned embodiment, a viscous material application unit that applies the viscous material to the mounting target is provided in the viscous material application device. Furthermore, the mounting target held by a mounting target holding unit may be tilted, and the viscous material application unit may apply the viscous material to the mounting target. In this case, the viscous material application unit is an example of a "working portion" in the claims.

Alternatively, the present disclosure may be applied to a mounting target working device as a reflow device that reflows a viscous material such as solder on a mounting target. In this case, instead of the head unit according to the aforementioned embodiment, a laser light irradiation unit that emits laser light in order to reflow the viscous material on the mounting target is provided in the reflow device. Furthermore, the mounting target held by a mounting target holding unit may be tilted, and the laser light irradiation unit may emit laser light in order to reflow the viscous material on the mounting target. In this case, the laser light irradiation unit is an example of a "working portion" in the claims.

Alternatively, the present disclosure may be applied to a mounting target working device as a mounting target inspection device that inspects a mounting target with visible light, infrared light, an X-ray, or the like. In this case, instead of the head unit according to the aforementioned embodiment, an inspection unit that irradiates the mounting target with visible light, infrared light, an X-ray, or the like and images the mounting target is provided in the mounting target inspection device. Furthermore, the mounting target held by a mounting target holding unit may be tilted, and the inspection unit may irradiate the mounting target with visible light, infrared light, an X-ray, or the like and image the mounting target in order to inspect the mounting target. In this case, the inspection unit is an example of a "working portion" in the claims.

While the example in which the mounting target has the flat work target surfaces (the horizontal work target surface and the tilted work target surfaces) has been shown in the aforementioned embodiment, the present disclosure is not restricted to this. According to the present disclosure, the mounting target may have non-flat work target surfaces (work target surfaces as curved surfaces). Alternatively, the mounting target may have both a flat work target surface(s) and a non-flat work target surface(s).

While the example in which the mounting target has one horizontal work target surface and four tilted work target surfaces has been shown in the aforementioned embodiment, the present disclosure is not restricted to this. According to the present disclosure, the mounting target may have two or more horizontal work target surfaces. Furthermore, according to the present disclosure, the mounting target may have one or a plurality of tilted work target surfaces other than four.

While the example in which both the tilt mechanism and the rotation mechanism are supported in a cantilever manner has been shown in the aforementioned embodiment, the present disclosure is not restricted to this. According to the present disclosure, the tilt mechanism may not be supported in a cantilever manner by the lift mechanism as long as the rotation mechanism is supported in a cantilever manner by the tilt mechanism. For example, the tilt mechanism may be supported from both sides by the lift mechanism.

While the example in which the tilt mechanism and the rotation mechanism are supported in a cantilever manner in the horizontal direction has been shown in the aforementioned embodiment, the present disclosure is not restricted to this. According to the present disclosure, the tile mechanism and the rotation mechanism may be supported in a cantilever manner in a direction other than the horizontal direction.

While the example in which the attachment direction (first attachment direction) of the tilt mechanism with respect to the lift mechanism and the attachment direction (second attachment direction) of the rotation mechanism with respect to the tilt mechanism are substantially perpendicular to each other in the planar view has been shown in the aforementioned embodiment, the present disclosure is not restricted to this. According to the present disclosure, the attachment direction (first attachment direction) of the tilt mechanism with respect to the lift mechanism and the attachment direction (second attachment direction) of the rotation mechanism with respect to the tilt mechanism may not be substantially perpendicular to each other in the planar view. For example, the attachment direction (first attachment direction) of the tilt mechanism with respect to the lift mechanism and the attachment direction (second attachment direction) of the rotation mechanism with respect to the tilt mechanism may be substantially parallel to each other.

While the example in which the distance (D1, first distance) between the lift mechanism portion and the tilt mechanism in the attachment direction (first attachment direction) of the tilt mechanism with respect to the lift mechanism is shorter than the distance (D3, second distance) that the lift mechanism can move the mounting target in the upward-downward direction has been shown in the aforementioned embodiment, the present disclosure is not restricted to this. According to the present disclosure, the distance (first distance) between the lift mechanism and the tilt mechanism in the attachment direction (first attachment direction) of the tilt mechanism with respect to the lift mechanism may be equal to or greater than the distance (second distance) that the lift mechanism can move the mounting target in the upward-downward direction.

While the example in which the distance (D2, third distance) between the lift mechanism and the rotation mechanism in the attachment direction (second attachment direction) of the rotation mechanism with respect to the tilt mechanism is shorter than the distance (D3, second distance) that the lift mechanism can move the mounting target in the upward-downward direction has been shown in the aforementioned embodiment, the present disclosure is not restricted to this. According to the present disclosure, the distance (third distance) between the lift mechanism and the rotation mechanism in the attachment direction (second attachment direction) of the rotation mechanism with respect to the tilt mechanism may be equal to or greater than the distance (second distance) that the lift mechanism can move the mounting target in the upward-downward direction.

While the example in which the axis (A2) of the tilt mechanism extends in the direction substantially parallel to the array direction of the plurality of mounting heads (working heads) has been shown in the aforementioned embodiment, the present disclosure is not restricted to this. According to the present disclosure, the axis of the tilt mechanism may not extend in the direction substantially parallel to the array direction of the plurality of mounting heads (working heads). For example, the axis of the tilt mechanism may extend in a direction substantially perpendicular to the array direction of the plurality of mounting heads (working heads).

While the example in which the mounting target is conveyed by the mounting target conveyance portion via the placement member (placement portion) and is held by the mounting target holding unit via the placement member (placement portion) has been shown in the aforementioned embodiment, the present disclosure is not restricted to this. According to the present disclosure, the mounting target may be directly conveyed by the mounting target conveyance portion as long as the same can be conveyed. Alternatively, according to the present disclosure, the mounting target may be directly held by the mounting target holding unit as long as the same can be held.

While the example in which a mounting operation is performed on both the horizontal work target surface and the tilted work target surfaces of the mounting target being held by the mounting target holding unit has been shown in the aforementioned embodiment, the present disclosure is not restricted to this. According to the present disclosure, a mounting operation may not be performed on both the horizontal work target surface and the tilted work target surfaces of the mounting target being held by the mounting target holding unit. For example, a mounting operation may be performed on only the tilted work target surfaces of the mounting target being held by the mounting target holding unit.

While the example in which the single held portion is provided on the placement member has been shown in the aforementioned embodiment, the present disclosure is not restricted to this. According to the present disclosure, a plurality of held portions may be provided on the placement member.

While the example in which the mounting target holding unit is configured to hold the mounting target by grasping has been shown in the aforementioned embodiment, the present disclosure is not restricted to this. According to the present disclosure, the mounting target holding unit may be configured to hold the mounting target by a method other than grasping. For example, the mounting target holding unit may be configured to hold the mounting target by suctioning the mounting target by a negative pressure.

While the example in which the mounting target working device is configured such that the mounting target holding unit can be replaced with the mounting target backup unit has been shown in the aforementioned embodiment, the present disclosure is not restricted to this. According to the present disclosure, the mounting target working device may be configured such that the mounting target holding unit can be replaced with a unit other than the mounting target backup unit.

While the example in which the feeder arrangement portion is provided only at the end of the base on one side (Y2 side), and the tape feeders are disposed thereat has been shown in the aforementioned embodiment, the present disclosure is not restricted to this. According to the present disclosure, the feeder arrangement portion may be provided at each of ends of the base on both sides (both sides in the direction Y), and the tape feeders may be disposed thereat.

While the processing operations of the controller are described, using the flowchart described in a manner driven by a flow in which processing is performed in order along a processing flow for the convenience of illustration in the aforementioned first embodiment, the present disclosure is not restricted to this. According to the present disclosure, the processing operations of the controller may be performed in an event-driven manner in which processing is performed on an event basis. In this case, the processing operations may be performed in a complete event-driven manner or in a combination of an event-driven manner and a manner driven by a flow.

What is claimed is:

1. A mounting target working device comprising:
   a mounting target holder configured to hold a three-dimensional shape mounting target including a tilted surface on which an electrical component is mounted and having a three-dimensional shape, the mounting target holder including:
      a holder configured to hold the three-dimensional shape mounting target;
      a lift mechanism configured to move the three-dimensional shape mounting target held by the holder in an upward-downward direction;
      a tilt mechanism attached to the lift mechanism and configured to tilt the three-dimensional shape mounting target held by the holder; and
      a rotation mechanism attached to the tilt mechanism and configured to rotate the three-dimensional shape mounting target held by the holder, and the rotation mechanism is supported in a cantilever manner by the tilt mechanism; and
   a working portion includes a plurality of working heads linearly arrayed; the plurality of working heads are configured to perform work when a mounting target surface of the three-dimensional shape mounting target is configured to extend in a direction substantially parallel to an array direction of the plurality of working heads.

2. The mounting target working device according to claim 1, wherein:
   the tilt mechanism is supported in a cantilever manner by the lift mechanism.

3. The mounting target working device according to claim 2, wherein:
   the tilt mechanism is supported in the cantilever manner by the lift mechanism in a horizontal direction, and
   the rotation mechanism is supported in the cantilever manner by the tilt mechanism in the horizontal direction.

4. The mounting target working device according to claim 3, wherein:
   the lift mechanism, the tilt mechanism, and the rotation mechanism are disposed such that a first attachment direction of the tilt mechanism with respect to the lift mechanism and a second attachment direction of the rotation mechanism with respect to the tilt mechanism are substantially perpendicular to each other in a planar view.

5. The mounting target working device according to claim 2, wherein:
   a first distance between the lift mechanism and the tilt mechanism in a first attachment direction of the tilt mechanism with respect to the lift mechanism is shorter than a second distance that the lift mechanism can move the three-dimensional shape mounting target in the upward-downward direction, and
   a third distance between the lift mechanism and the rotation mechanism in a second attachment direction of the rotation mechanism with respect to the tilt mechanism is shorter than the second distance that the lift mechanism can move the three-dimensional shape mounting target in the upward-downward direction.

6. The mounting target working device according to claim 1, wherein:
   the holder of the mounting target holder is configured to hold the three-dimensional shape mounting target via a placement member on which the three-dimensional shape mounting target is placed.

7. The mounting target working device according to claim 6, wherein:
   the placement member includes a placement portion and a single held portion, and
   the holder of the mounting target holder is configured to hold the three-dimensional shape mounting target via the placement portion by grasping the held portion.

8. The mounting target working device according to claim 1, wherein: the tilt mechanism of the mounting target holder is configured to tilt the three-dimensional shape mounting target by rotating the three-dimensional shape mounting target about an axis that extends in a direction substantially parallel to an array direction of the plurality of working heads.

9. The mounting target working device according to claim 3, wherein:
   a first distance between the lift mechanism and the tilt mechanism in a first attachment direction of the tilt mechanism with respect to the lift mechanism is shorter than a second distance that the lift mechanism can move the three-dimensional shape mounting target in the upward-downward direction, and
   a third distance between the lift mechanism and the rotation mechanism in a second attachment direction of the rotation mechanism with respect to the tilt mechanism is shorter than the second distance that the lift mechanism can move the three-dimensional shape mounting target in the upward-downward direction.

10. The mounting target working device according to claim 4, wherein:
    a first distance between the lift mechanism and the tilt mechanism in a first attachment direction of the tilt mechanism with respect to the lift mechanism is shorter than a second distance that the lift mechanism can move the three-dimensional shape mounting target in the upward-downward direction, and
    a third distance between the lift mechanism and the rotation mechanism in a second attachment direction of the rotation mechanism with respect to the tilt mechanism is shorter than the second distance that the lift mechanism can move the three-dimensional shape mounting target in the upward-downward direction.

11. The mounting target working device according to claim 2, wherein:
    the holder of the mounting target holder is configured to hold the three-dimensional shape mounting target via a placement member on which the three-dimensional shape mounting target is placed.

12. The mounting target working device according to claim 3, wherein:
    the holder of the mounting target holder is configured to hold the three-dimensional shape mounting target via a placement member on which the three-dimensional shape mounting target is placed.

13. The mounting target working device according to claim 4, wherein:
    the holder of the mounting target holder is configured to hold the three-dimensional shape mounting target via a placement member on which the three-dimensional shape mounting target is placed.

14. The mounting target working device according to claim 5, wherein:

the holder of the mounting target holder is configured to hold the three-dimensional shape mounting target via a placement member on which the three-dimensional shape mounting target is placed.

15. The mounting target working device according to claim 2, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

16. The mounting target working device according to claim 3, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

17. The mounting target working device according to claim 4, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

18. The mounting target working device according to claim 5, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

19. The mounting target working device according to claim 6, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

20. The mounting target working device according to claim 7, wherein:

the working portion includes a plurality of working heads linearly arrayed, and the tilt mechanism of the mounting target holder is configured to tilt the three-dimensional shape mounting target by rotating the three-dimensional shape mounting target about an axis that extends in a direction substantially parallel to an array direction of the plurality of working heads.

\* \* \* \* \*